(12) United States Patent
Winter

(10) Patent No.: US 7,545,159 B2
(45) Date of Patent: Jun. 9, 2009

(54) ELECTRICAL TEST PROBES WITH A CONTACT ELEMENT, METHODS OF MAKING AND USING THE SAME

(75) Inventor: John M. Winter, Wrentham, MA (US)

(73) Assignee: Rika Denshi America, Inc., Attleboro, MA (US)

( * ) Notice: Subject to any disclaimer, the term of this patent is extended or adjusted under 35 U.S.C. 154(b) by 0 days.

(21) Appl. No.: 11/621,717

(22) Filed: Jan. 10, 2007

(65) Prior Publication Data
US 2007/0296436 A1    Dec. 27, 2007

Related U.S. Application Data

(60) Provisional application No. 60/803,652, filed on Jun. 1, 2006.

(51) Int. Cl.
G01R 31/02    (2006.01)
G01R 31/28    (2006.01)

(52) U.S. Cl. ............... 324/761; 324/158.1; 324/756

(58) Field of Classification Search ......... 324/754–765, 324/158.1; 439/482; 29/874–876, 885
See application file for complete search history.

(56) References Cited

U.S. PATENT DOCUMENTS

| | | | |
|---|---|---|---|
| 3,435,168 A | | 3/1969 | Cooney |
| 3,562,643 A | * | 2/1971 | Smith ................. 324/72.5 |
| 4,773,877 A | * | 9/1988 | Kruger et al. ............ 439/482 |
| 5,003,255 A | | 3/1991 | Kazama |
| 5,084,673 A | * | 1/1992 | Kazama ................ 324/761 |
| 5,115,563 A | * | 5/1992 | Wilson ................. 29/876 |
| 5,744,977 A | * | 4/1998 | Cuautla ................ 324/761 |
| 6,053,777 A | * | 4/2000 | Boyle ................. 439/700 |
| 6,159,056 A | * | 12/2000 | Boyle ................. 439/700 |
| 6,275,054 B1 | * | 8/2001 | Boyle ................. 324/754 |
| 6,377,059 B2 | * | 4/2002 | Vinther et al. ............ 324/754 |
| 6,398,592 B1 | * | 6/2002 | Mori et al. ............. 439/700 |
| 6,462,567 B1 | * | 10/2002 | Vinther et al. ............ 324/754 |
| 6,506,082 B1 | * | 1/2003 | Meek et al. ............. 439/700 |
| 6,652,326 B2 | * | 11/2003 | Boyle et al. ............ 439/700 |
| 6,667,629 B2 | | 12/2003 | Souza et al. |
| 6,685,492 B2 | * | 2/2004 | Winter et al. ............ 439/219 |
| 6,844,749 B2 | * | 1/2005 | Sinclair ................ 324/761 |

(Continued)

FOREIGN PATENT DOCUMENTS

EP    0245787 A1    11/1987

(Continued)

OTHER PUBLICATIONS

International Search Report and Written Opinion; International Application No. PCT/US2007/012375; International Filing Date May 23, 2007; Applicant's file reference RIK-0021-PCT; Date of mailing Apr. 12, 2007; 13 pages.

(Continued)

*Primary Examiner*—Ha Tran T Nguyen
*Assistant Examiner*—Joshua Benitez
(74) *Attorney, Agent, or Firm*—Cantor Colburn LLP

(57) ABSTRACT

Disclosed herein are electrical test probes and methods for making the same. In one embodiment, an electrical test probe comprises: a barrel, a plunger, a contact element, and a spring. The barrel comprises a contact area defined by a stop engagement and an opening at a first end of the barrel. The plunger is slidably disposed through the opening, the contact element, and the contact area. The plunger comprises a tip and a stop protrusion with a plunger extension extending therebetween. The contact element is disposed in the contact area, between the barrel and the plunger. The spring is in operational engagement with the plunger.

21 Claims, 8 Drawing Sheets

U.S. PATENT DOCUMENTS

| | | |
|---|---|---|
| 6,922,496 B2 * | 7/2005 | Morris ........................ 385/14 |
| 7,025,602 B1 * | 4/2006 | Hwang ........................ 439/66 |
| 7,025,630 B2 * | 4/2006 | Laverick ..................... 439/578 |
| 7,253,647 B2 * | 8/2007 | Lee ............................. 324/754 |
| 7,256,593 B2 * | 8/2007 | Treibergs .................... 324/754 |

FOREIGN PATENT DOCUMENTS

| | | | |
|---|---|---|---|
| EP | 0405323 | A2 | 1/1991 |
| JP | 2003172747 | A1 | 6/2003 |

OTHER PUBLICATIONS

EP0405323; Jan. 2, 1991; Michael Seeliger; English abstract only; 3 pages.

EP0245787; Nov. 19, 1987; Klaus Giringer; English abstract only; 4 pages.

JP2003172747; Jun. 20, 2003; Kamiya Takeshi; English abstract only; 1 page.

Introducing the Titanium Pro ICT Series, Path to Peak Performance; IDI; Catalog and Source Book; Sixth Edition; pp. 42-47, Released: Aug. 1, 2000.

* cited by examiner

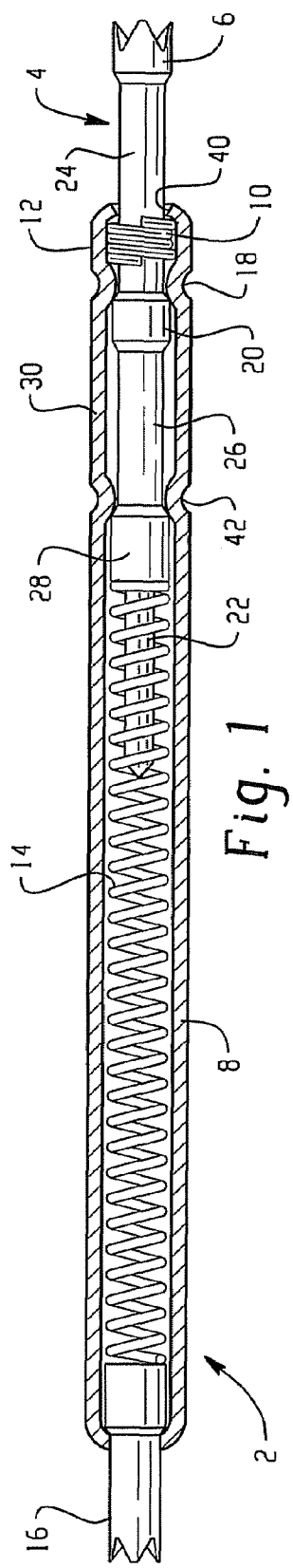
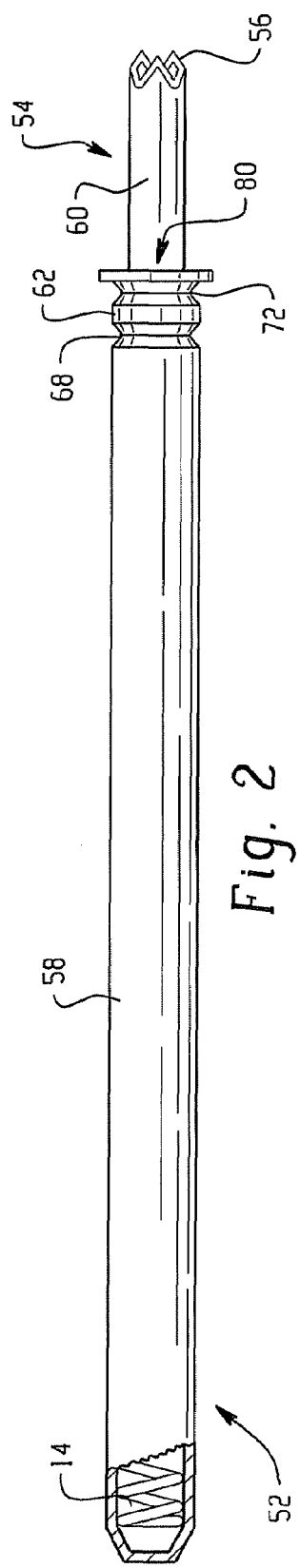
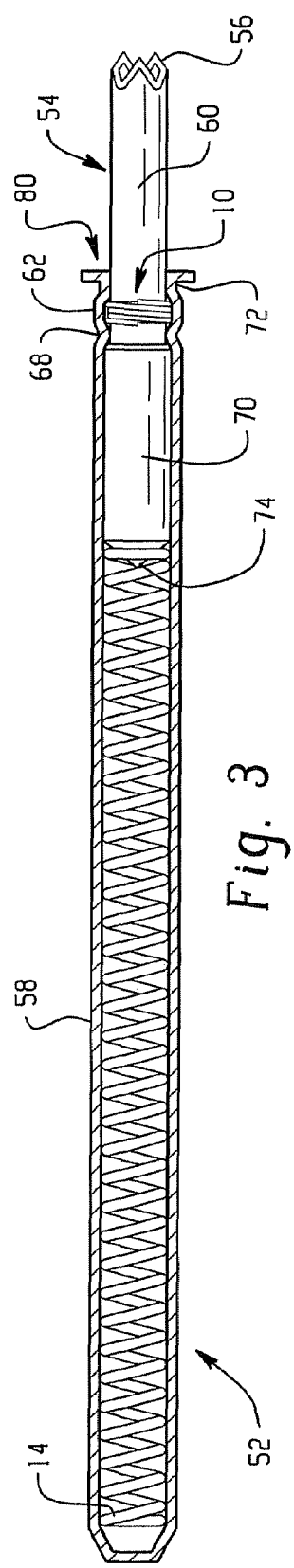

ELECTRICAL TEST PROBES WITH A CONTACT ELEMENT, METHODS OF MAKING AND USING THE SAME

CROSS REFERENCE TO RELATED APPLICATIONS

This application claims the benefit of the filing date of U.S. Provisional Application Ser. No. 60/803,652 filed on Jun. 1, 2006, and incorporated herein by reference in its entirety.

BACKGROUND

This disclosure relates to electrical test probes that may be used to test integrated circuits and other electronic assemblies, and to interconnect subassemblies in equipment.

During testing, integrated circuit (IC) packages are removably mounted in sockets, which in turn are mounted on a circuit substrate, commonly referred to as a device-under-test board, or DUT board. The sockets house individual electrical test probes for electronically connecting each terminal of a device to be tested to an individual circuit path on the DUT board. The DUT board is in turn electrically connected to computerized test equipment.

Other electronic assemblies are typically tested in fixtures where a test probe is mounted in a mechanically or vacuum activated mechanism and are brought to engage the assembly to be tested. The fixtures are also connected to computerized test equipment.

It is desirable to have a high integrity signal path from the test equipment to the device being tested and for the overall resistance of the signal path to be low and consistent. This is also true for each segment of the overall signal path including the test probe housed in the test socket.

The electrical test probes can also be used as an interconnect mechanism between two electronic subassemblies. In operation, an electrical signal passes from one probe tip, through the barrel, and out the other probe tip. The test probe is usually put in a housing that separates the two electronic subassemblies. It is desirable to have constant, predictable impedance, a low consistent resistance, and a broad range of frequencies that can pass through the electrical test probes.

In all cases, it is desirable to have a high integrity signal path from the test equipment to the device being tested and for the overall resistance of the signal path to be low and consistent. This is true for each segment of the overall signal path including the test probe. Hence, a continuing need exists for reliable, low contact resistance, electrical test probes, and methods of making the same.

BRIEF SUMMARY

Disclosed herein are electrical test probes and methods for making the same. In one embodiment, an electrical test probe comprises: a barrel, a plunger, a contact element, and a spring. The barrel has a contact area defined by a stop engagement and an opening at a first end of the barrel. The plunger is slidably disposed through the opening, the contact element, and the contact area. The plunger comprises a tip and a stop protrusion with a plunger extension extending therebetween. The contact element is disposed in the contact area, between the barrel and the plunger. The spring is in operational engagement with the plunger.

In one embodiment, a method for operating an electronic test probe comprises: disposing a test probe in physical contact with a device to the tested, passing an electrical signal from the bottom of the test probe to the tip of the test probe and receiving back an electrical signal from the tip of the test probe to the bottom end. The signal passes between the barrel and the plunger in the contact area.

The above described and other features are exemplified by the following figures and detailed description.

BRIEF DESCRIPTION OF THE DRAWINGS

Refer now to the figures, which are exemplary, not limiting, and wherein like numbers are numbered alike.

FIG. 1 is a side, schematic, partial view of one embodiment of an electrical test probe.

FIG. 2 is a partial, cut-away, side view of another exemplary embodiment of an electrical test probe.

FIG. 3 is a partial, cross-sectional view of the test probe of FIG. 2.

DETAILED DESCRIPTION

Figure 4:
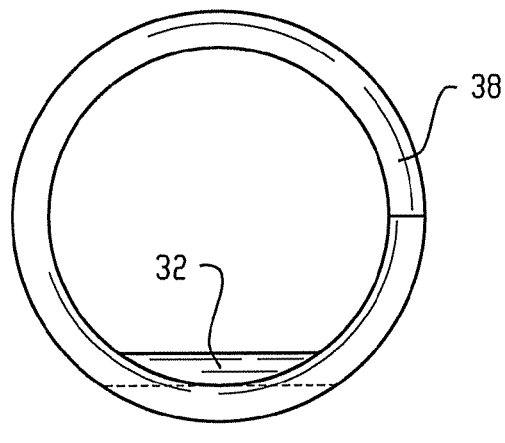
FIG. 4 is a frontal view of exemplary embodiment of a contact element.
Figure 5:
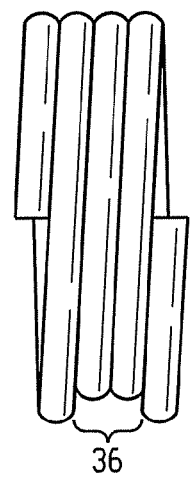
FIG. 5 is a side view of the contact element of FIG. 4.

Disclosed herein are electrical test probes that have low and consistent resistance because there is continuous, intimate (e.g., physical) contact between the contact element (e.g., coiled contact element), the barrel, and the plunger in the contact area. When such a test probe is used as a signal carrier in a coaxial environment, the signal always transfers to/from the barrel and the plunger (i.e., between the barrel and the plunger) at the contact area, thereby attaining a predictable and repeatable impedance value. For example, the test probe can be disposed in physical contact with a device to the tested (DUT). An electrical signal can then be passed from the bottom of the test probe (e.g., the end away from the DUT), across the barrel to the contact area, over to the plunger at the contact area, up to the tip of the test probe, and into the device being tested. A return electrical signal can then be received back from the device being tested at the tip of the test probe. This return signal passes from the tip, through the plunger, into the contact area where it travels to the barrel and back to the opposite end of the test probe. As is noted, the electrical signal consistently passes between the barrel and the plunger in the contact area.

The present design also avoids ringing or the loss of signal. Not to be bound by theory, the impedance value of a coaxial interconnect is the result of the geometry of the signal path compared to a surrounding ground field. When this geometry is consistent, then the impedance is consistent. When the signal path geometry changes as the plunger is activated, then the impedance changes along the length of the test probe.

In many test probe designs, when the signal transfers between the barrel and the plunger, there is the primary signal path down the main segment of the barrel and a secondary path down the "dead end" of the barrel. The portion of the signal that goes down the "dead end" segment will be reflected back to the contact area primary signal path. In high frequency applications, this reflection will distort the true signal and sometimes create a resonance situation; commonly referred to as the stub effect. However, if, as in the present design, the signal path is always through the contact area at an end of the barrel near the tip, then there will never be any stub segment, and there will be no signal distortions due to reflections.

Disclosed herein are electrical test probes that have predictable, repeatable impedance because the movement of the electrical signal from the test probe to the barrel is near (or, more specifically, at) the same point each time the probe is cycled. The test probe can have a portion extending from the external end of the barrel, through an opening in the barrel, into a contact area, e.g., a contact area having a constant diameter. Referring to FIG. 1, the test probe 2 comprises a receiving plunger 4 slidably disposed through an end of a barrel 8 opposite a transfer plunger 16, with a spring 14 disposed therebetween. It is noted that the term spring is intended to include springs as well as spring-like mechanisms that allow the receiving plunger to travel into the barrel, while placing force on the plunger to return to its original position.

The receiving plunger 4 comprises a tip 6 disposed at a first end of a plunger extension 24. The plunger extension 24, which comprises a substantially constant diameter, extends from the tip 6, through a contact area 12 of the barrel 8 to a stop protrusion 20. At a side of the stop protrusion 20 opposite the plunger extension 24, plunger section 26 extends from the stop protrusion 20 to a second protrusion 28. The spring 14 extends through the barrel 8 to the transfer plunger 16.

FIGS. 2 and 3 illustrate a partial side view and a partial cross-sectional view, respectively, of other embodiments of a test probe. This test probe 52 comprises a receiving plunger 54 with a tip 56 disposed at a first end of a plunger extension 60. The plunger extension 60 can comprise a substantially constant diameter from the tip 56 to a stop protrusion 70. The barrel 58 comprises a stop engagement 68 and a second engagement 72 bounding a contact area 62. These engagements, which can be roll crimps and the like, sufficiently decrease the barrel diameter at the engagement to inhibit the stop protrusion 70 from entering the contact area 62 and to maintain a contact element 10 within the contact area 62. Desirably, the engagements have a diameter that is greater than the diameter of the plunger extension 60 to inhibit physical and/or electrical communication between the barrel 58 and the plunger extension 60 at either of the engagements 68,72.

Within the contact area 62 is a contact element 10. In this design, receiving plunger 54 diameter is constant from the tip to a single stop protrusion 70. Around the plunger extension 60, in the contact area 62, is the contact element that provides a consistent point of electrical contact between the barrel 58 and the plunger extension 60.

During use of the test probe 2,52 the tip 6,56 of the receiving plunger 4,54 contacts a device under test, causing the actuation of the plunger 4,54 away from the device under test, toward the opposite end of the barrel, e.g., toward the transfer plunger 16. This movement of the receiving plunger 4,54 causes a portion of the plunger extension 24,60 to pass through the contact area 12,62, the contact element 10, past the stop engagement 18,72 and into optional barrel portion 30. As the plunger extension 24 moves away from the device under test, the second protrusion 28,70 advances toward the transfer plunger 16, compressing the spring 14. Meanwhile, an electrical signal is passed through the transfer plunger 16 (from the bottom of the test probe) to the tip of the test probe and an electrical signal is received back from the tip of the test probe back to the transfer plunger 16. These electrical signals pass between the barrel 8,58 and the receiving plunger 4,54 (e.g., the plunger extension 24,60) in the contact area 12,62 that is located at the opening 40.

When the tip 6,56 engages the device under test, an electrical signal passes through the tip 6,56 and the plunger extension 24,60. As the signal enters the barrel 8,58, it moves from the plunger extension 24,60 through the contact element 10 and to the barrel 8,58. The signal then passes along the barrel 8,58 and to a receiver (not shown). Since the diameter of the plunger extension 24,60 is substantially constant, and since the plunger extension always contacts the barrel 8,58 at the same point, namely the contact element 10, the signal is always transferred to the barrel in the contact area 12,62. As a result, the impedance for the electrical test probe 2,52 is predictable and repeatable. However, in designs that rely upon biasing springs and typical plungers, the transfer point of the signal to the barrel is not a fixed point. As a result, their impedance is not predictable and repeatable. Additionally, the resistance, e.g., of test probe 52 is reduced and repeatable with an average resistance of less than or equal to 20 milliohms (mOhm)

The contact element 10 is disposed around the plunger extension 24,60 in the contact area 12,62, continuously, physically contacting the contact area 12,62 to create an electrical pathway from the plunger extension 24,60 through the contact element 10 to the barrel 8,58. Desirably, the physical contact is sufficient to enable the desired electrical communication while minimizing friction. The diameter of the contact element 10 and the plunger extension 24,60 are substantially constant such that the impedance does not change due to a change in diameter between one signal transfer and another signal transfer (e.g., if the plunger extension 24,60 was conical). The contact element 10 can be a monolithic element (e.g., a ring, washer, and so forth), a coiled element, and so forth, that physically and slidably contacts the plunger extension 24,60.

The contact element can be formed of a material that, for example, is a sufficient conductor (e.g., has an electrical conductivity that is greater than or equal to that of the plunger extension 24,60), has a sufficient degree of elasticity, and that is capable of withstanding the conditions in which the test probe will be utilized. Possible materials include those employed for the plunger extension and/or barrel, such as beryllium (Be), copper (Cu), nickel (Ni), and so forth, as well as combinations comprising at least on of the foregoing, ferrous materials (such as steel, stainless steel, and so forth), brass, and super alloys, e.g., in the form of a wire (such as stainless steel wire, music wire, and so forth). These contact elements can also, optionally be coated, e.g., with gold (Au), palladium (Pd), cobalt (Co), and so forth, as well as combinations comprising at least one of the foregoing materials. For example, the contact element can comprise a coiled, gold plated BeCu wire, a gold plated stainless steel wire, or a coiled, PdCo plated BeCu wire. The coil contact element, for example, can be formed using a variety of techniques (e.g., a coil winding machine, stamping, and the like).

Figure 6:
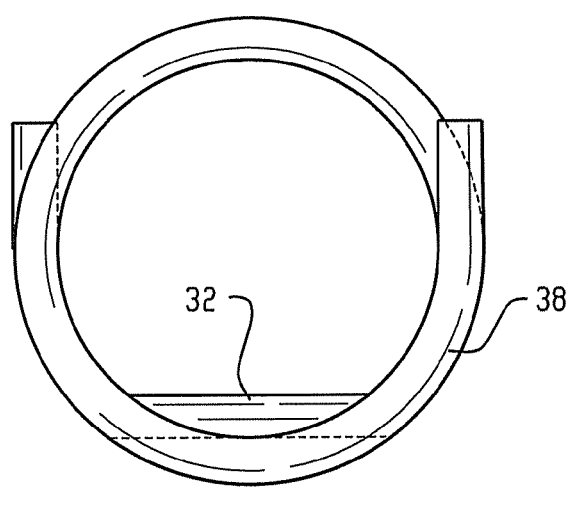
FIG. 6 is a front view of another exemplary embodiment of a contact element.
Figure 7:
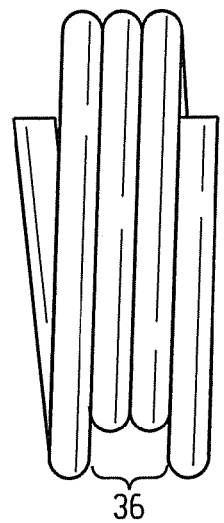
FIG. 7 is a side view of the contact element of FIG. 6.
Figure 8:
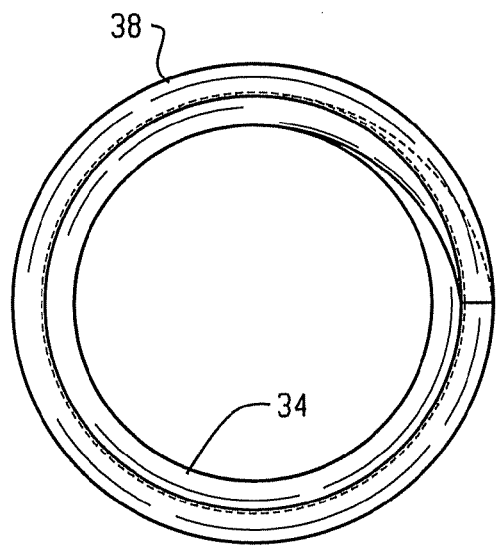
FIG. 8 is a front view of yet another exemplary embodiment of a contact element.
Figure 9:
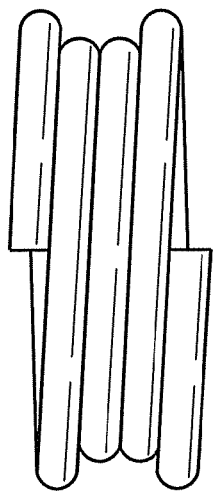
FIG. 9 is a side view of the contact element of FIG. 8.
Figure 10:
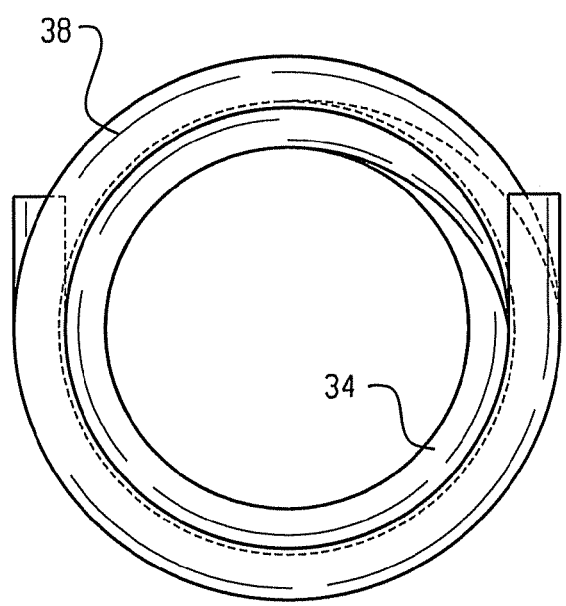
FIG. 10 is a front view of another exemplary embodiment of a contact element.
Figure 11:
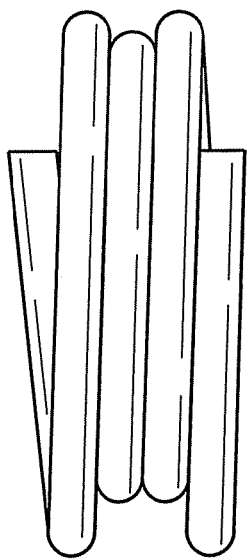
FIG. 11 is a side view of the contact element of FIG. 10.

Various exemplary designs of coiled contact elements 10 are illustrated in FIGS. 4-11. FIGS. 5, 7, 9, and 11, illustrate exemplary coiled contact elements that can be disposed around the plunger extension 24,60 in the contact area 12,62. These elements are designed to contact the plunger extension 24,60 in a reduced diameter portion 36 that forms a plunger extension contact portion 32, while the full diameter portion 38 forms barrel contact portion 38. As can be seen from FIGS. 4 and 6 versus FIGS. 8 and 10, the plunger extension contact portion can contact the plunger extension around the whole periphery of the portion of the plunger extension in the reduced diameter portion 36 (FIGS. 8 and 10), or a portion thereof (FIGS. 4 and 6). The contact element 10 comprises a design that enables physical, slidable engagement with the plunger extension 24,60 and physical engagement with the barrel 8,58 in contact area 12,62. (See FIGS. 1-3)

A coiled contact element 10 can comprise various types of terminating coil arrangements (e.g., the ends of the coil can comprise full, half, and quarter turns of the terminating coil(s), and/or the like, with square ends, round ends, etc., which are open, closed, tapered, tucked in, turned in, and/or the like). Similarly, other arrangements of contact elements and plunger geometries can be utilized that provide electrical communication between the plunger 4 and the barrel 8,58 in the contact area 12,62. Similarly, the coiled contact element has a sufficient number of turns to attain the desired electrical contact between the plunger and the barrel. Generally, the number of turns is less than or equal to about 10 turns in order to minimize the size of the element, although more turns are possible and invisioned. More specifically, the coiled contact element can comprise less than or equal to about 7 turns.

In order to retain the contact element 10 in a desired location in the barrel 8,58, a lip, crimp (e.g., roll crimp 68 (FIGS. 2-3)), or otherwise reduced barrel diameter opening 40 (FIG. 1) is disposed at one side of the contact element 10, while the stop engagement 18,72 is disposed on the other side of the contact element 10. The receiving plunger 4,54 has a stop protrusion 20,70 disposed on a side of the stop engagement 18,72, respectively, opposite the contact element 10. In a fully extended position (i.e., when the receiving plunger 4,54 is in its fully extended position), the stop protrusion 20,70 can engage the stop engagement 18,72, thereby preventing further extension of the receiving plunger 4,54 out of the barrel 8,58.

A second side of the stop protrusion 20,70 can engage an actuating spring 14 or a plunger section 26 can be disposed between the stop protrusion 20 and the second protrusion 28. In the latter embodiment, e.g., FIG. 1, the second protrusion 28, in a fully extended plunger position, can engage a second engagement 42 on one side, and the spring 14 on a second side. The protrusion 28,70 (accordingly), can comprise an anchor element 22 optionally extending from the second side, to receive the spring 14 and enabling facile probe assembly. Other alignment designs can be employed such as a bore disposed on the second side, wherein the bore is capable of receiving an end of the spring as shown in FIG. 2 and 3.

Suitable barrel materials include any electrically and thermally conductive material capable of withstanding the conditions in which the test probes will be utilized. Possible materials for the barrels can comprise copper, brass, nickel, ferrous materials, and so forth, as well as combinations comprising at least one of the foregoing, such as steel, stainless steel, and super alloys. The barrels can be formed using a variety of techniques such as tube drawing, deep drawing, automatic lathing, and/or the like.

Suitable plunger materials include any material having sufficient strength to withstanding the forces on the plunger, and being capable of withstanding the test probe operating conditions. Possible plunger materials include ferrous materials, beryllium, copper, platinum, cobalt, palladium, and so forth, as well as combinations comprising at least on of the foregoing, e.g., a steel plunger extension with a tip having a palladium-cobalt coating thereon. The plungers can be formed using a variety of techniques such as machining (e.g., lathing), casting, and so forth.

Suitable materials for any of the foregoing compression springs can comprise any material that is capable of exerting a biasing force and that is capable of withstanding the conditions in which the test probes will be utilized. Examples of suitable materials for the spring include relatively high tensile strength materials such as, but not limited to, stainless steel wire, music wire, and/or the like, and combinations comprising at least one of the foregoing. The springs can be formed using a variety of techniques (e.g., a coil winding machine, and the like).

Optionally, component(s) of the test probe (e.g., the barrel, plunger(s), tip(s), contact element, and/or spring) can comprise a coating of an electrically conductive material on all of a portion of their surface. Some possible coating materials include gold, silver, platinum, palladium, cobalt, nickel, and so forth, as well as combinations comprising at least one of the foregoing.

The following examples are merely exemplary and are intended to further illustrate the present probes, and are not intended to limit the scope hereof.

EXAMPLES

The resistance and reproducibility of the resistance was tested for different test probe designs.

Figure 12:
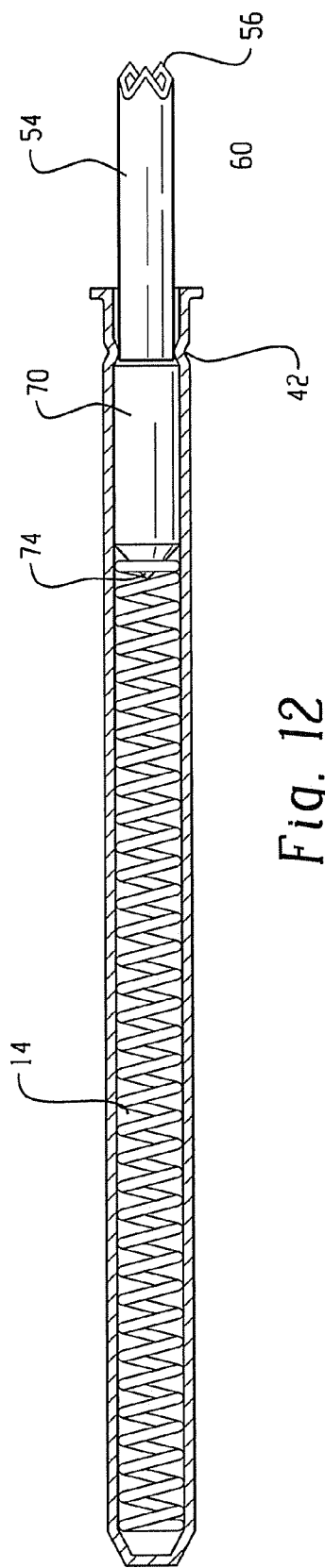
FIG. 12 is a cross-sectional view of a test probe without the contact element tested for resistance in Example 1.

Sample 1 was the test probe illustrated in FIG. 12. This probe comprised a receiving plunger 54 comprises a tip 56 disposed at a first end of a plunger extension 60. The plunger extension 60, which comprised a constant diameter, extended from the tip 56 to a stop protrusion 70. At a side of the stop protrusion 70 opposite the plunger extension 60, was an alignment element that received a spring 14. The spring 14 extended through the barrel 58. This test probe had a 0.68 mm diameter, 11.13 mm long, gold plated nickel-silver barrel, with a roll crimp 42. The stop protrusion (also known as the plunger) was gold plated, hardened BeCu with a 0.41 mm diameter, with a 2.6 mm extension out of the barrel and a 2.54 mm travel into the barrel. The spring 14 was a gold plated, stainless steel spring, while the stop protrusion (also known as the plunger) was gold plated, hardened BeCu.

Sample 2, illustrated in FIGS. 2 and 3, comprised the same materials and overall dimensions as Sample 1. The contact area had a length of 0.39 mm, and the contact element 10 was a 7 turn, gold plated, BeCu spring.

Figure 13:
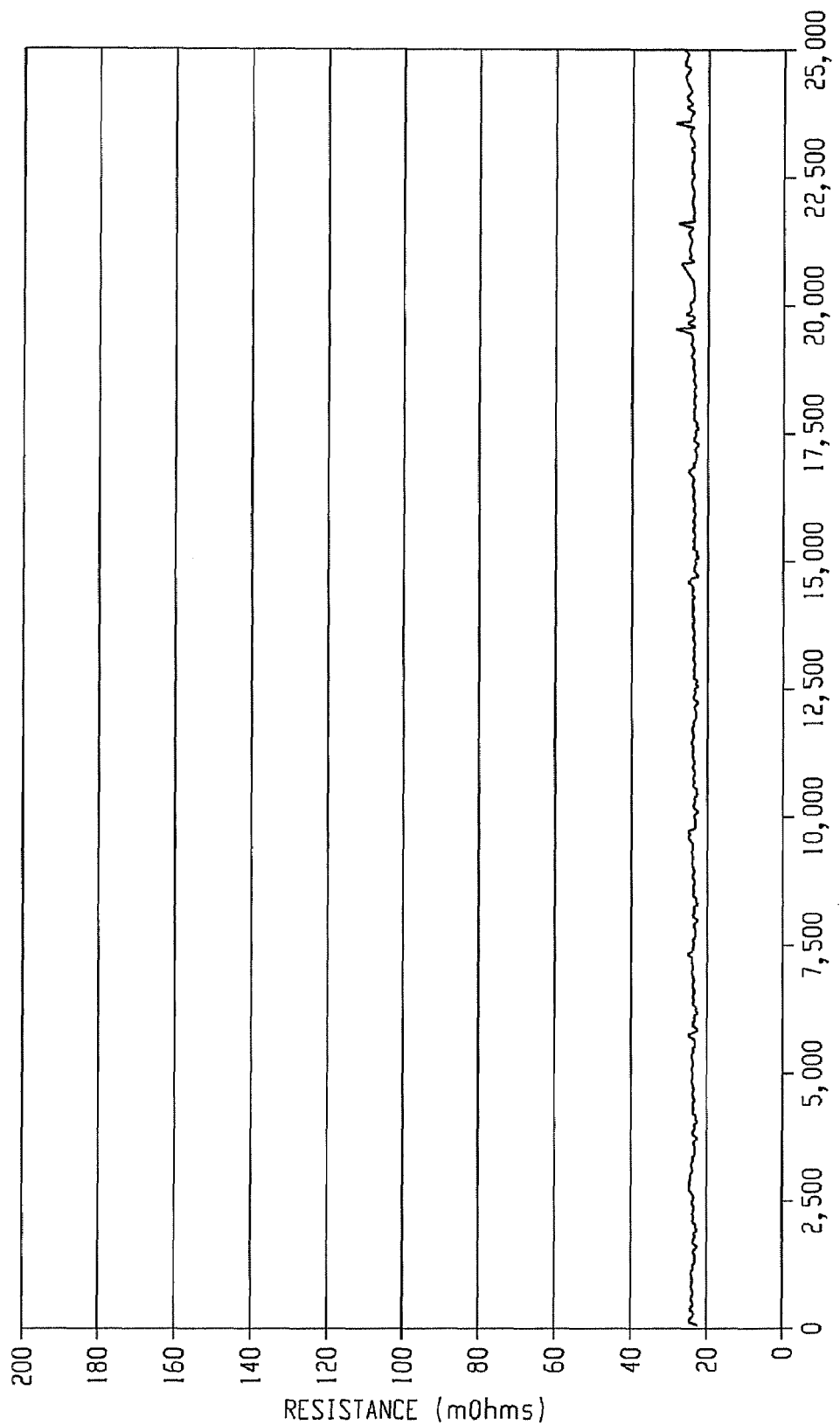
FIG. 13 is a graphical representation of average resistance versus cycles for the test probe of the type illustrated in FIG. 12.
Figure 14:
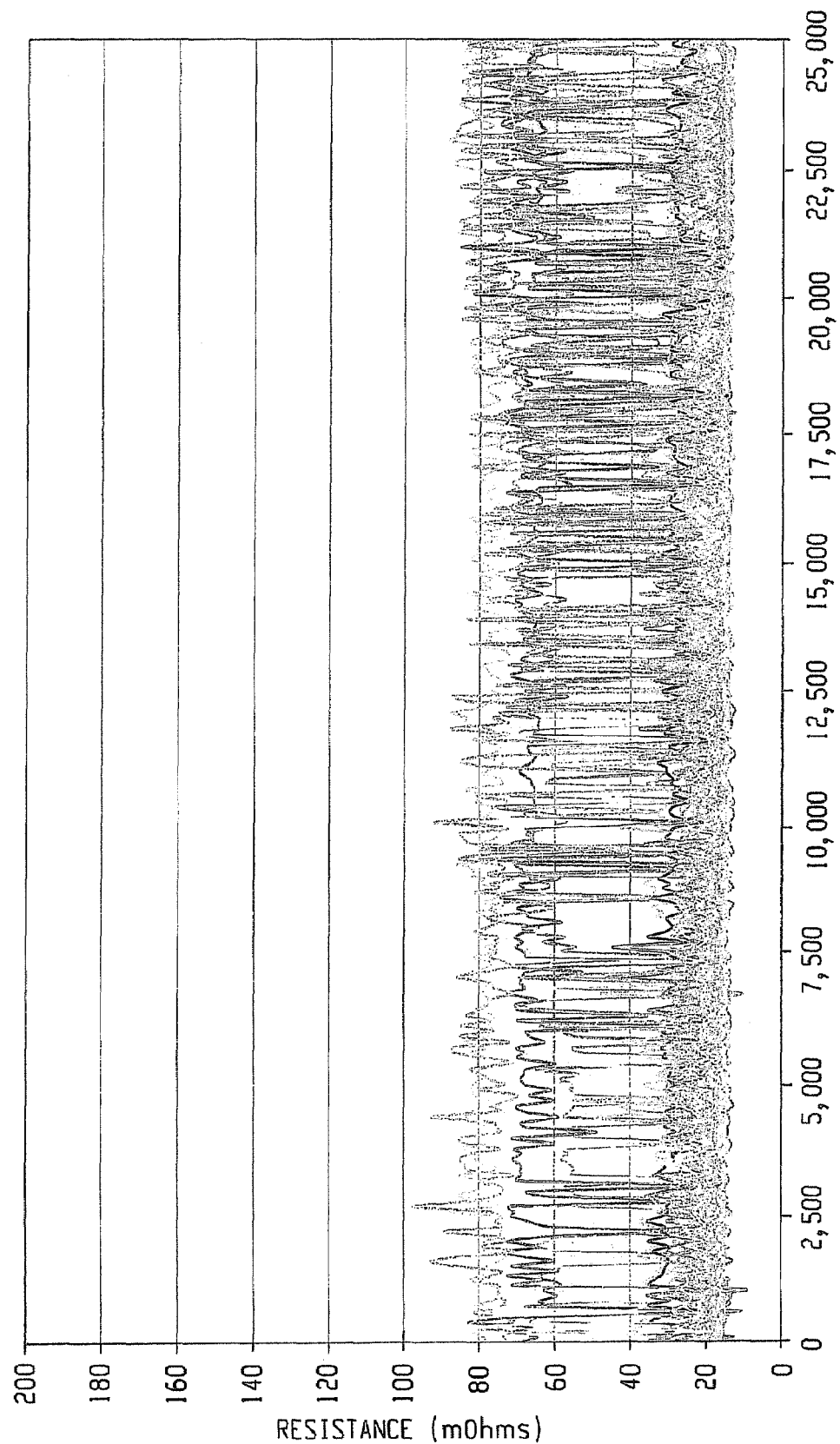
FIG. 14 is a graphical representation of actual resistance versus cycles for 50 test probes of the type illustrated in FIG. 12.
Figure 15:
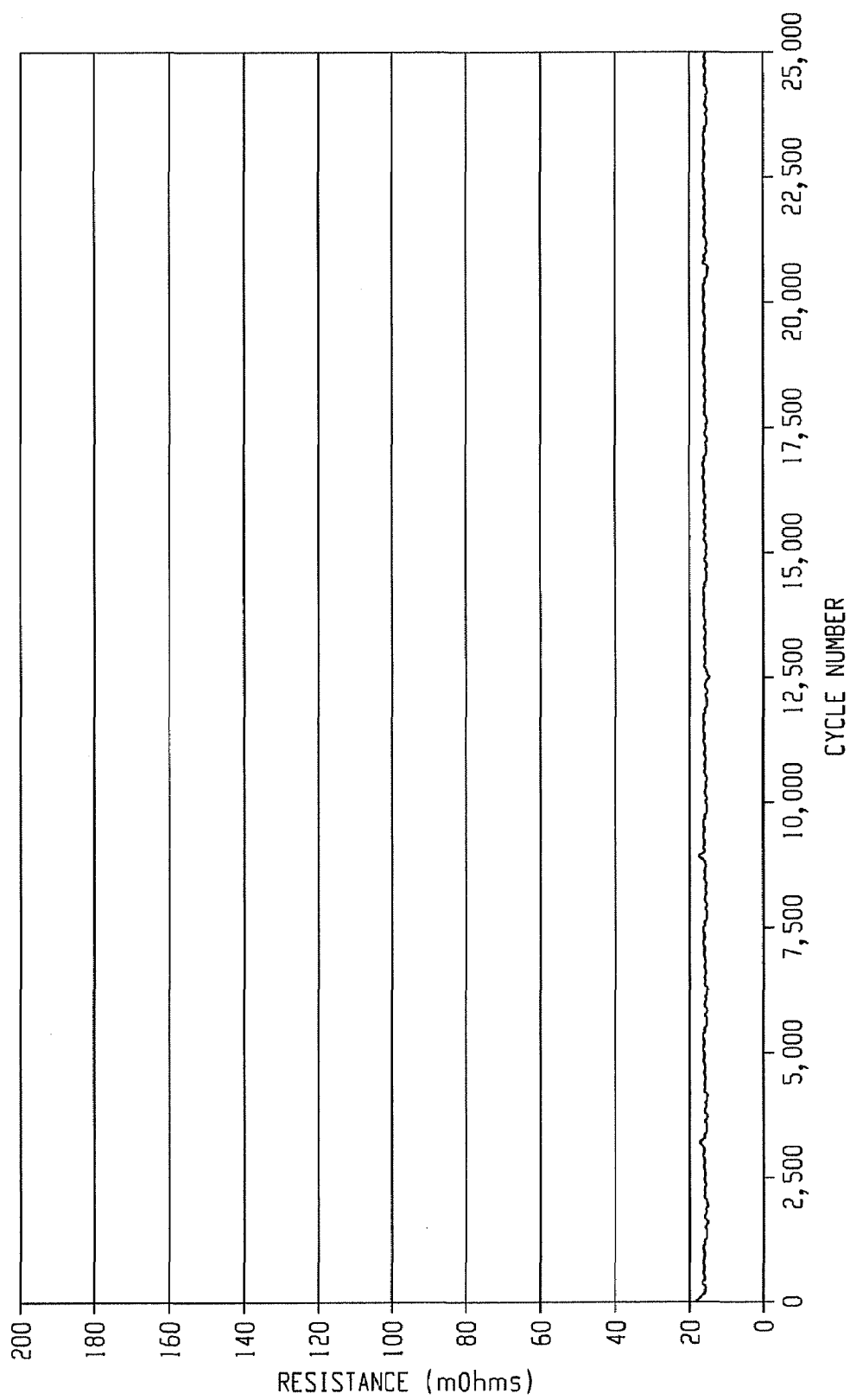
FIG. 15 is a graphical representation of average resistance versus cycles for the test probe of the type illustrated in FIGS. 2 and 3.
Figure 16:
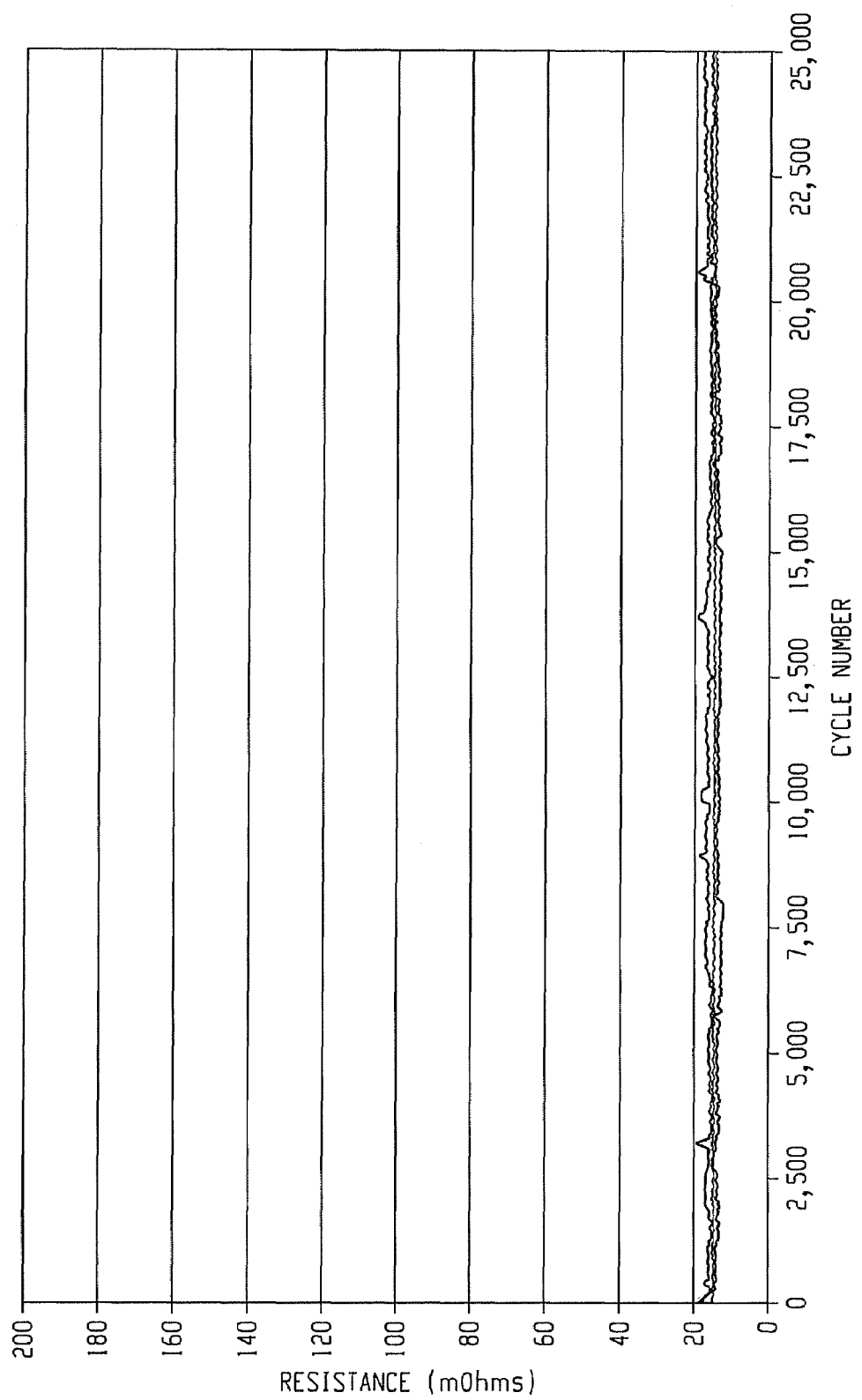
FIG. 16 is a graphical representation of actual resistance versus cycles for 3 test probes of the type illustrated in FIGS. 2 and 3.

Samples 1 and 2 were tested for resistance over a number of cycles. The results for Sample 1 are illustrated in FIGS. 13 and 14, while the result for Sample 2 are illustrated in FIGS. 15 and 16. As is clear in these figures, Sample 1 had an average contact resistance of 24.4 mOhms while Sample 2 had an average contact resistance of 17 mOhm; a greater than 25% reduction in resistance (actually 30% resistance reduction). Additionally, when 50 test probes of Sample 1 were tested for consistency, a range of resistance of up to 80 mOhms was obtained (24.4 mOhms with a standard deviation of 17.6 mOhms). (See FIG. 14) The results for Sample 2 (using 3 test probes), showed a substantially better consistency (17 mOhms with a standard deviation of 3.5); a nearly 5 fold improvement in consistency.

In the present probe design, since the electrical signal does not travel down the spring, but instead moves from the plunger to the barrel close to the barrel opening, the resistance is reduced. For example, resistances of less than or equal to about 50 milliohms, or, more particularly, less than or equal to about 35 milliohms, or even more particularly, less than or equal to about 25 milliohms, and yet more particularly, less than or equal to 20 milliohms, have been proven to be attainable. In addition to these advantages, the design of the test probe enables the production of a smaller, more compact probe.

Ranges disclosed herein are inclusive and combinable (e.g., ranges of "up to about 25 vol %, or, more specifically, about 5 vol % to about 20 vol %", is inclusive of the endpoints and all intermediate values of the ranges of "about 5 vol % to about 25 vol %." etc.). "Combination" is inclusive of blends, mixtures, alloys, reaction products, and the like. Furthermore, the terms "first," "second," and the like, herein do not denote any order, quantity, or importance, but rather are used to distinguish one element from another, and the terms "a" and "an" herein do not denote a limitation of quantity, but rather denote the presence of at least one of the referenced item. The modifier "about" used in connection with a quantity is inclusive of the state value and has the meaning dictated by context, (e.g., includes the degree of error associated with measurement of the particular quantity). The suffix "(s)" as used herein is intended to include both the singular and the plural of the term that it modifies, thereby including one or more of that term (e.g., the colorant(s) includes one or more colorants). Reference throughout the specification to "one embodiment", "another embodiment", "an embodiment", and so forth, means that a particular element (e.g., feature, structure, and/or characteristic) described in connection with the embodiment is included in at least one embodiment described herein, and can or can not be present in other embodiments. In addition, it is to be understood that the described elements can be combined in any suitable manner in the various embodiments.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from essential scope thereof. Therefore, it is intended that the invention not be limited to the particular embodiment disclosed as the best mode contemplated for carrying out this invention but that the invention will include all embodiments falling within the scope of the appended claims.

What is claimed is:

1. An electrical test probe, comprising:
   a barrel comprising an opening at a first end of the barrel, a barrel portion, a stop engagement located between the opening and the barrel portion, and a contact area defined by the opening and the stop engagement;
   a plunger slidably disposed through the opening and the contact area, the plunger comprising a tip and a stop protrusion with a plunger extension extending there between, wherein the stop protrusion is located in the barrel portion;
   a contact element disposed in the contact area, between the barrel and the plunger, wherein the plunger is slidably disposed through and in physical contact with the contact element; and
   a spring in operational engagement with the plunger.

2. The probe of claim 1, wherein the contact element is a coiled element comprising a plunger extension contact portion formed by a reduced diameter portion of the coiled element.

3. The probe of claim 1, wherein the contact element is disposed in continuous physical contact with the barrel and the plunger.

4. The probe of claim 1, wherein the plunger further comprises a connector disposed between the stop protrusion and a second protrusion, wherein the barrel further comprises a second engagement, and wherein the second protrusion is disposed on a side of the second engagement opposite the stop engagement.

5. The probe of claim 1, further comprising a transfer plunger extending through an end of the barrel opposite the opening.

6. The probe of claim 1, further comprising a resistance of less than or equal to about 50 milliohms.

7. The probe of claim 6, wherein the resistance is less than or equal to about 25 milliohms.

8. The probe of claim 1, wherein the contact element further comprises a coating of an electrically conductive material.

9. The probe of claim 8, wherein the electrically conductive material is selected from a group consisting of gold, silver, platinum, palladium, cobalt, nickel, and combinations comprising at least one of the foregoing electrically conductive materials.

10. The probe of claim 9, wherein the electrically conductive material is selected from the group consisting of platinum, palladium, cobalt, and combinations comprising at least one of the foregoing electrically conductive materials.

11. The probe of claim 1, wherein the contact element further comprises less than or equal to about 10 turns.

12. An electrical test probe, comprising:
    a barrel comprising an opening at a first end of the barrel, a barrel portion, a stop engagement located between the opening and the barrel portion, and a contact area defined by the opening and the stop engagement;
    a plunger slidably disposed through the opening and the contact area, the plunger comprising a tip and a stop protrusion with a plunger extension extending there between, wherein the stop protrusion is located in the barrel portion;
    an electrically conductive, coiled contact element disposed in the contact area, between the barrel and the plunger, wherein the plunger is slidably disposed through the contact element wherein the contact element creates a signal path between the barrel and the plunger; and
    a spring in operational engagement with the plunger.

13. A method for operating an electrical test probe, comprising:
    disposing a test probe in physical contact with a device to be tested, wherein the test probe comprises
    a barrel comprising an opening at a first end of the barrel, a barrel portion, a stop engagement located between the opening and the barrel portion, and a contact area defined by the opening and the stop engagement;
    a plunger slidably disposed through the opening and the contact area, the plunger comprising a tip and a stop protrusion with a plunger extension extending there between, wherein the stop protrusion is located in the barrel portion; and
    a contact element disposed in the contact area, between the barrel and the plunger, wherein the plunger is slidably disposed through the contact element wherein the contact element creates a signal path between the barrel and the plunger;

passing an electrical signal from the tip through the plunger and to the barrel; and repeating passing the electrical signal from the tip through the plunger and to the barrel, wherein the electrical signal passes from the plunger to the barrel in the contact area.

14. An electrical test probe, comprising:

a barrel comprising a contact area defined by a first engagement and a second engagement, and comprising a barrel portion, wherein the first engagement is disposed near a first end of the barrel, and wherein the second engagement is located between the contact area and the barrel portion;

a plunger slidably disposed through the opening and the contact area, the plunger comprising a tip and a stop protrusion with a plunger extension extending there between, wherein the stop protrusion is located in the barrel portion;

a contact element disposed in the contact area, between the barrel and the plunger extension, wherein the plunger is slidably disposed through and in physical contact with the contact element; and a spring in operational engagement with the plunger.

15. The probe of claim 14, further comprising a resistance of less than or equal to about 50 milliohms.

16. The probe of claim 14, wherein the contact element further comprises a coating of an electrically conductive material selected from a group consisting of gold, silver, platinum, palladium, cobalt, nickel, and combinations comprising at least one of the foregoing electrically conductive materials.

17. The probe of claim 16, wherein the electrically conductive material is selected from the group consisting of platinum, palladium, cobalt, and combinations comprising at least one of the foregoing electrically conductive materials.

18. The probe of claim 14, wherein the contact element further comprises less than or equal to about 10 turns.

19. The probe of claim 14, wherein the physical contact is continuous physical contact with the plunger and the barrel.

20. The probe of claim 1, wherein the contact element is inhibited from moving with the plunger by the opening and the stop engagement.

21. An electrical test probe, comprising:

a barrel comprising an opening at a first end of the barrel, a barrel portion, a stop engagement located between the opening and the barrel portion, and a contact area defined by the opening and the stop engagement;

a plunger slidably disposed through the opening and the contact area, the plunger comprising a tip and a plunger section with a plunger extension extending therebetween, wherein the plunger section is located in the barrel portion;

a contact element disposed in the contact area, between the barrel and the plunger, wherein the contact element is in physical contact with the plunger extension and the barrel, and wherein the plunger is slidably disposed through the contact element such that, in use, the plunger extension can slide through the contact element into the barrel portion; and a spring in operational engagement with the plunger.

* * * * *